(12) United States Patent
Smith

(10) Patent No.: US 6,714,084 B2
(45) Date of Patent: Mar. 30, 2004

(54) HIGH RESOLUTION DIGITAL CONTROLLED OSCILLATOR

(75) Inventor: Sterling Smith, Hsinchu (TW)

(73) Assignee: MStar Semiconductor, Inc., Hisnchu Hsien (TW)

( * ) Notice: Subject to any disclaimer, the term of this patent is extended or adjusted under 35 U.S.C. 154(b) by 8 days.

(21) Appl. No.: 10/144,413

(22) Filed: May 9, 2002

(65) Prior Publication Data

US 2002/0167360 A1 Nov. 14, 2002

Related U.S. Application Data

(60) Provisional application No. 60/290,473, filed on May 11, 2001.

(51) Int. Cl.$^7$ .............................. H03B 21/00; H03L 7/00
(52) U.S. Cl. ......................................... 331/1 A; 327/105
(58) Field of Search .......................... 331/1 A, 16, 17, 331/18; 327/105, 107

(56) References Cited

U.S. PATENT DOCUMENTS

| | | | |
|---|---|---|---|
| 5,786,778 A | * | 7/1998 | Adams et al. ................. 341/61 |
| 6,208,211 B1 | * | 3/2001 | Zipper et al. .................. 331/17 |
| 6,414,555 B2 | * | 7/2002 | Staszewski et al. ........... 331/18 |

* cited by examiner

Primary Examiner—Robert Pascal
Assistant Examiner—Joseph Chang
(74) Attorney, Agent, or Firm—J.C. Patents

(57) ABSTRACT

The present invention provides a frequency synthesis circuit. The frequency synthesis circuit includes a noise-shaping quantizer and a digitally controlled oscillator. The noise-shaping quantizer responsive to a plurality of input bits for shaping error signals resulting from the quantization conversion such that most of the error occurs at high frequency. The digitally controlled oscillator is connected to the output of the quantizer having an output frequency responsive to the output of the quantizer.

15 Claims, 5 Drawing Sheets

FINE CONTROL INPUTS

| BINARY DATA | A | B | C | D |
|---|---|---|---|---|
| 000 | 0 | 0 | 0 | 0 |
| 001 | 0 | 0 | 0 | 1 |
| 010 | 0 | 0 | 1 | 1 |
| 011 | 0 | 1 | 1 | 1 |
| 111 | 1 | 1 | 1 | 1 |

FIG. 4

HIGH RESOLUTION DIGITAL CONTROLLED OSCILLATOR

CROSS-REFERENCE TO RELATED APPLICATION

This application claims the priority benefits of U.S. provisional application titled" "HIGH RESOLUTION DIGITAL CONTROLLED OSCILLATOR" filed on May 11, 2001, serial No. 60/290,473. All disclosure of this application is incorporated herein by reference.

BACKGROUND OF THE INVENTION

1. Field of the Invention

The present invention relates to an apparatus for a frequency synthesizer, and more specifically a frequency synthesizer with a high resolution digitally controlled oscillator.

2. Description of Related Art

A digitally controlled oscillator (DCO) is a type of variable frequency oscillator which has a frequency of oscillation that is a function of a digital input signal. Other types of common oscillators include voltage controlled oscillators (VCO), and current controlled oscillators (ICO). These oscillators however are very sensitive to 1/f noise, and input voltage/current noise. The input voltages and currents are susceptible to interference noise & drift. These oscillators also are very susceptible to frequency drift. DCOs have the possible advantage of exhibiting much better noise immunity, can easily maintain a desired frequency, require less redesign effort due to scaling, may have lower power dissipation, and are easy to implement in low cost CMOS processes. However most DCO configurations have a limited resolution due to matching and size limitations (6–10 bits typ.). One of the most common implementations of a DCO is in a phase lock loop PLL. In a PLL the DCO must be capable of being adjusted in small enough increments so as to result in quantization related frequency and phase jitter which are below predetermined limits. Furthermore, the delay element of the present invention has highly reduced sensitivity to 1/f noise. It is achieved by using a circuit with reduced sensitivity because control is digital.

Another major problem in PLL design is clock jitter. Clock jitter can be defined as the deviations in a clock's output transition from their ideal positions, whether it be leading or lagging. Causes of clock jitter can include power supply noise, random thermal noise, mechanical vibration, and a dead-band within the phase detector that does not detect small phase errors. DCO's have a disadvantage of not being able to generate a continuous range of frequencies, but instead produce a finite number of discrete frequencies. This makes it desirable to have small quantization steps to reduce jitter as much as possible. A specific embodiment of the invention utilizes its design in a phase lock loop for digitizing RGB signals. In such an application a further major cause of jitter is the inputted reference signal to the PLL. In typical analog PLLs for this application minimizing the jitter from the reference signal is a function of the PLL bandwidth. However by narrowing the bandwidth of the PLL, the PLL's ability to correct long term jitter becomes more limited.

Therefore a need exists for a frequency synthesizer with high immunity to jitter and noise, and can be manufactured in a low cost CMOS process.

SUMMARY OF THE INVENTION

In one preferred embodiment of the invention a quantizer with a high resolution input is connected to a low resolution digitally controlled oscillator (DCO).

It is a further object of the present invention to provide such a DCO that operates with low levels of jitter.

Another object of the invention is to provide a DCO controlled by a high resolution input.

In order to achieve the above objectives, according to an aspect of the present invention, a high resolution DCO frequency synthesizer is provided that allows for low-jitter and improved noise immunity. The frequency synthesizer of the invention in its simplest form consists of a noise-shaping quantizer with high resolution input, and a digitally controlled oscillator with low resolution input. The quantizer spectrally shapes the quantizer error pushing most of the error into higher frequencies and therefore lowering error in the operating frequency range. The DCO acts naturally as a lowpass filter removing much of the high frequency error.

These and other features, which characterize the invention, are set forth in the claims annexed hereto and forming a further part hereof. However, for a better understanding of the invention, and of the advantages and objectives attained through its use, reference should be made to the drawings, and to the accompanying descriptive matter, in which there is described exemplary embodiments of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 4 is a chart showing the thermometer encoding of the fine control bits.

DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. The preferred embodiments are described in sufficient detail to enable these skilled in the art to practice the invention, and it is to be understood that other embodiments may be utilized and that logical, changes may be made without departing from the spirit and scope of the present invention. The following detailed description is, therefore, not to be taken in a limiting sense, and the scope of the present invention is defined only be the appended claims.

Figure 1:
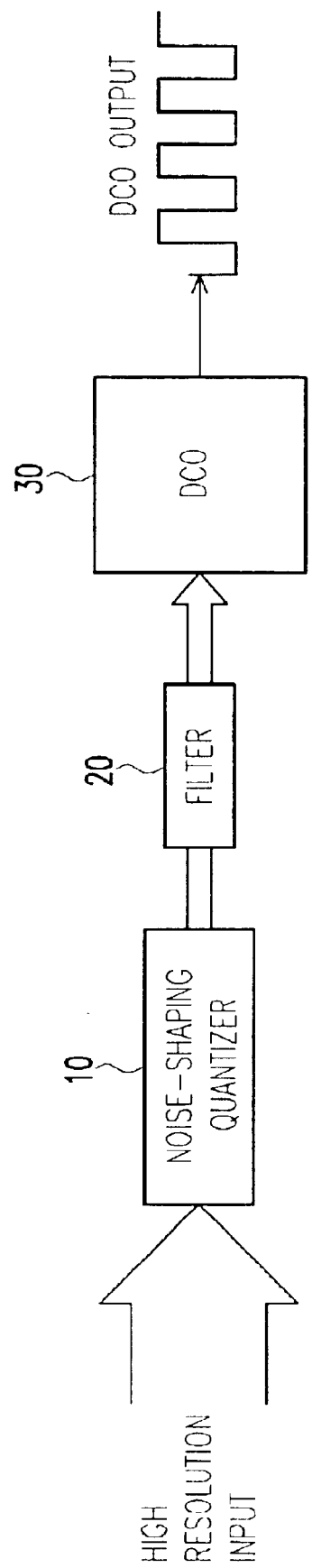
FIG. 1 is a block diagram showing a preferred embodiment of the invention.

FIG. 1 shows an embodiment of the invention. A noise-shaping quantizer 10 is inputted with a high resolution input that consists of a plurality of bits. The quantizer converts a high resolution input to a lower resolution output in such a way as to spectrally shape the quantizer error (difference between quantizer input and output) so that most of the error is at high frequencies. Noise-shaping quantizers are typically categorized by the number of bits in their output, and their order. The order of the noise-shaping quantizer can be designed to fit a specific application, as is known in the art higher order quantizers allow for stronger attenuation at low frequencies for the quantization noise. The modulation method used by the noise-shaping quantizer can include delta, sigma-delta, pulse density, pulse width modulation and so forth. The quantizer can further include a memory or without a memory. The quantizer output is then used to control the input to a digitally controlled oscillator DCO 30. It should be recognized that a variety of DCO configurations can be incorporated into the design to be responsive to the output of a quantizer including DCOs consisting of a high frequency oscillator with programmable dividers, DCOs consisting of a ring oscillators and so forth. The DCO combined with the quantizer of the present invention provides the function of filtering which can greatly lower phase error because the quantizer rapidly changes the frequency between the quantized values. The phase error can be expressed as the integral of frequency over time. Therefore the phase error is limited to small values due to this integral relationship between the frequency and phase of the oscillator. This omission of the analog low pass filter eliminates a very sensitive node between the quantizer and the delay elements which can further improve performance and reduce size.

Figure 2:
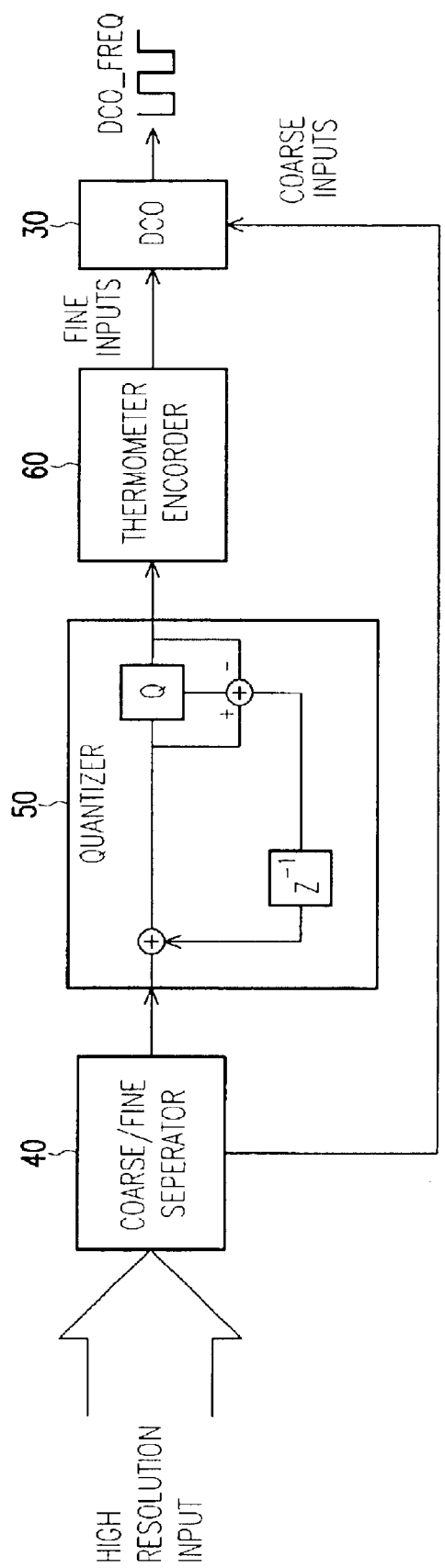
FIG. 2 is a block diagram showing another preferred embodiment of the invention.

FIG. 2 shows a preferred embodiment of the invention, intended for use in a line-locked PLL for video graphics a/d. For the purposes of illustration only, reference will be made to specific bus widths, frequencies and the like. One skilled in the art will recognize that the present invention is not limited to this specific embodiment, and can be more generally applied to other circuits and methods. A high resolution input consisting of 24 bits is inputted to coarse/fine separator 40. The high resolution input can originate from a loop filter as an example. The coarse/fine separator 40 provides control bits for the DCO 30. The separator outputs a plurality of coarse control bits to the DCO 30 directly, and sends the remaining bits used for fine control to the input of a first order sigma-delta quantizer 50. Sigma-delta quantizers are known in the art. (S. R. Norsworthy, R Schreier, and G. C. Themes, *Delta-sigma Data Converters: Theory, Design, and Simulation*, IEEE PRESS, 1997.). Delta-Sigma conversion forces an error signal during conversion outside a predetermined frequency BWsd, by over-sampling and noise shaping techniques. Use of the first order sigma-delta quantizer 50 results in a peak Jitter/Tosc ratio (where Tosc is equal to 1/DCO_FREQ) that is constant and independent of even the feedback divider ratio of a PLL application. This allows for very low DCO jitter that is approximately limited to:

$$\frac{\Delta T \max}{T} = \frac{\Delta F}{F}$$

where ΔT is the peak jitter and where $$\frac{\Delta F}{F}$$

is the relative frequency change for 1 LSB of the quantized DCO fine control input.

The quantizer outputs a low resolution plurality of bits to a thermometer encoder. The thermometer encoder simplifies the design of the DCO 30, however one skilled in the art will recognize that the output of the quantizer can also directly control the DCO 30. The output of the thermometer encoder is provided as the fine control bits to the DCO 30. The coarse control bits allow a wide range of frequencies to be chosen, and can provide frequency correction when the input frequency is changing significantly or upon device startup. The fine control bits allow the DCO 30 to operate at frequencies between the coarse frequency levels, and allow for fine tuning of the DCO frequency, for example when a phase correction is required in a PLL application. This method for improved quantization granularity improves in the reduction of jitter for the DCO.

Figure 3:
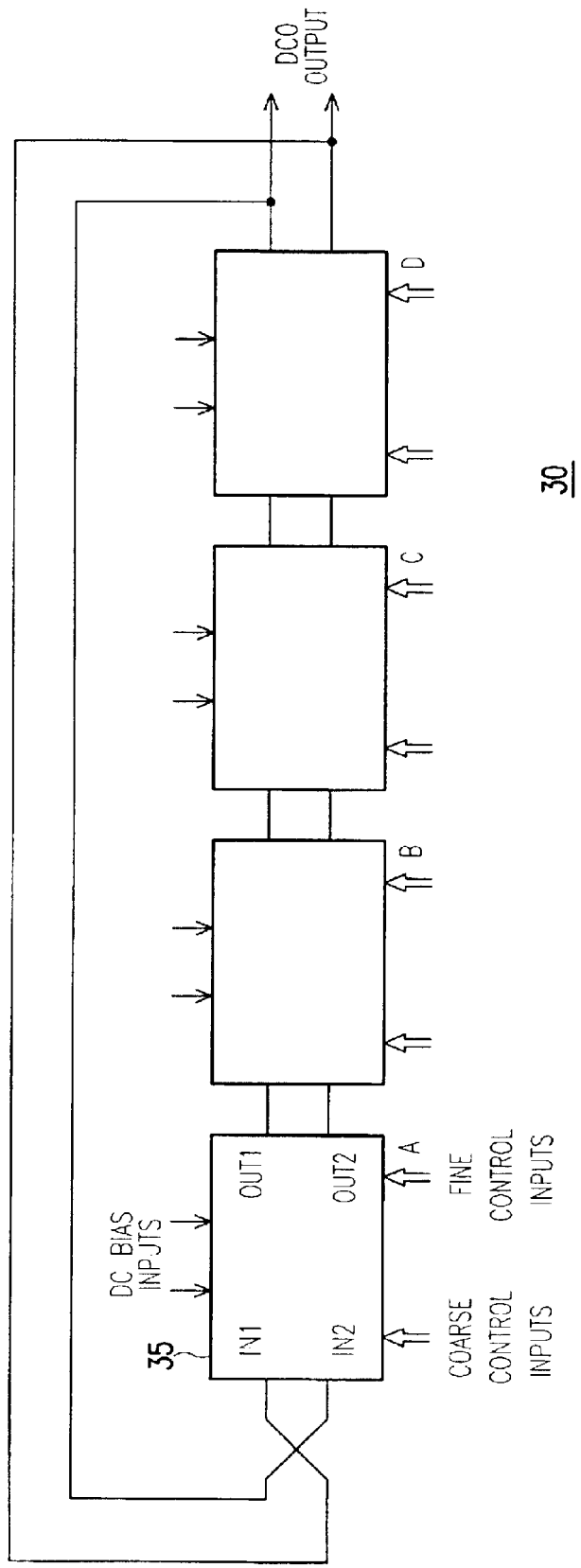
FIG. 3 is a block diagram showing the DCO of the invention.

FIG. 3 shows the digitally controlled oscillator 30 of the invention. When the circuit shown in FIG. 3 is incorporated into a line-locked PLL for video graphics a/d conversion, the DCO of the circuit embodiment will output a frequency in the range of 12 MHz to approx. 200 MHz. The DCO 30 is composed of a plurality of digitally controlled delay devices 35 each of which is essentially the same except for their individual fine control inputs. Each delay device 35 has two digital inputs: a coarse control, and a fine control. The coarse control in a preferred embodiment of the invention is a plurality of bits from the output of the coarse/fine separator 40. The fine control is used to allow the DCO to output a frequency that falls between the frequencies selected by the coarse control. FIG. 4 shows an example of thermometer encoding as it applies to the design shown in FIG. 3. Each delay element 35 is provided with a thermometer coded bit labeled A, B, C, and D.

Figure 5:
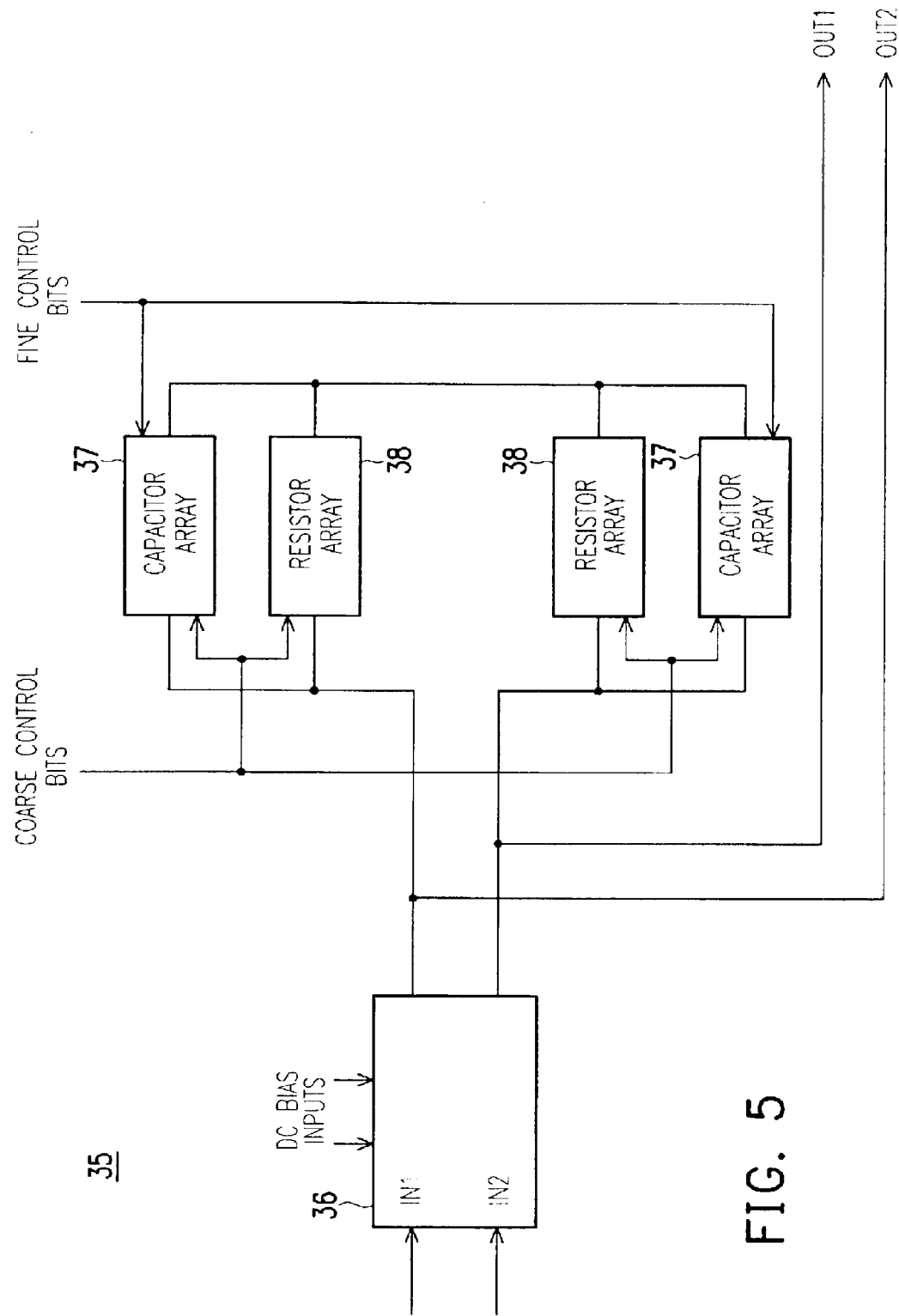
FIG. 5 is a block diagram showing a delay element of the DCO of the invention.

FIG. 5 further shows an example of one of the delay elements. The inputs IN1 and IN2 enter stage 36. IN1 and IN2 are essentially the same signals but 180° out of phase. In stage 36 a DC bias is applied. The negative and positive outputs are then inputted into two sets of capacitors 37 and resistor arrays 38. The coarse control inputs control the majority of the capacitor array and the resistor array, while the fine control bits control the remaining elements of the capacitor array. The arrays determine the propagation delay of the element which is outputted to the next delay element on the output lines OUT1 and OUT2.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A frequency synthesis circuit comprising:
   a noise-shaping quantizer responsive to a plurality of input bits for shaping error signals resulting from a quantization conversion such that most of errors occurs at a higher frequency, and
   a digitally controlled oscillator coupled to an output of the noise-shaping quantizer having an output frequency responsive to the output of the noise-shaping quantizer,
   wherein the digitally controlled oscillator comprises:
      a plurality of digitally controlled delay devices coupled in cascade, wherein each of the delay devices has two input ends, two output ends, a coarse control input end, and a fine control input end,
      wherein a first one of the delay devices also receive output signals fed back from a last one of the delay devices at the two input ends,
      wherein the coarse control input end receives a coarse control signal to select coarse frequencies, and the fine control input end receives a fine control signal from the noise-shaping quantizer to adjust the coarse frequencies into fine frequencies.

2. The frequency synthesis circuit of claim 1, wherein the noise-shaping quantizer and the digitally controlled oscillator together perform a function of filtering to lower a phase error by rapidly changing the frequency between quantized values.

3. A frequency synthesis circuit comprising:

a coarse/fine separator for separating a plurality of inputted bits into a plurality of bits as a coarse control signal and a plurality of bits as a fine control signal;

a delta-sigma quantizer receiving the fine control signal for shaping error signals resulting from a quantization conversion such that most of errors occurs at higher frequencies;

a thermometer encoder coupled to an output of the delta-sigma quantizer for thermometer encoding the fine control bits; and a digitally controlled oscillator having an output frequency responsive to the coarse and fine control signals.

4. The frequency synthesis circuit of claim 3, wherein the digitally controlled oscillator comprises:

a plurality of digitally controlled delay devices coupled in cascade, wherein each of the delay devices has two input ends, two output ends, a coarse control input end, and a fine control input end, wherein a first one of the delay devices also receive output signals fed back from a last one of the delay devices at the two input ends, wherein the coarse control input end receives a coarse control signal from the coarse/fine separator to select coarse frequencies, and the fine control input end receives a fine control signal from the coarse/fine separator to adjust the coarse frequencies into fine frequencies.

5. A method for controlling a frequency of a digitally controlled oscillator, comprising the steps of:

separating a plurality input signals into coarse and fine control bits;

performing noise-shaping quantization on the plurality of bits representing the fine control bits shaping error signals such that most of the error occurs at high frequency;

lowering phase error by rapidly changing the frequency between quantized values; and controlling a digitally controlled oscillator with the coarse and fine control signals.

6. The method of claim 5 further comprising the steps of:

generating a plurality of output bits lesser in quantity compared to the input bits.

7. The method of claim 6 further comprising the steps of:

creating an output signal at a variable frequency.

8. A frequency synthesis circuit comprising:

a coarse/fine separator for separating a plurality of inputted bits into a plurality of bits as a coarse control signal and a plurality of bits as a fine control signal;

a delta-sigma quantizer receiving the fine control signal for shaping error signals resulting from a quantization conversion such that most of errors occurs at higher frequencies;

a thermometer encoder coupled to an output of the delta-sigma quantizer for thermometer encoding the fine control bits; and a digitally controlled oscillator having an output frequency responsive to the coarse and fine control signals, wherein the delta-sigma quantizer and the digitally controlled oscillator together perform a function of filtering to lower a phase error by rapidly changing the frequency between quantized values.

9. The frequency synthesis circuit of claim 8, wherein the digitally controlled oscillator comprises:

a plurality of digitally controlled delay devices coupled in cascade, wherein each of the delay devices has two input ends, two output ends, a coarse control input end, and a fine control input end, wherein a first one of the delay devices also receive output signals fed back from a last one of the delay devices at the two input ends, wherein the coarse control input end receives a coarse control signal from the coarse/fine separator to select coarse frequencies, and the fine control input end receives a fine control signal from the coarse/fine separator to adjust the coarse frequencies into fine frequencies.

10. A digitally controlled oscillator comprises:

a plurality of digitally controlled delay devices coupled in cascade, wherein each of the delay devices has two input ends, two output ends, a coarse control input end, and a fine control input end, wherein a first one of the delay devices also receive output signals fed back from a last one of the delay devices at the two input ends, wherein the coarse control input end receives a coarse control signal to select coarse frequencies, and the fine control input end receives a fine control signal to adjust the coarse frequencies into fine frequencies.

11. A frequency synthesis circuit, comprising:

means for converting an input control signal into a fine control signal and a coarse control signal;

a noise-shaping quantizer for quantizing said fine control signal; and a digitally controlled oscillator for generating an output signal having an output frequency responsive to said coarse control signal and said quantized fine control signal;

wherein said quantized fine control signal is used for adjusting said output frequency within frequency levels determined by said coarse control signal.

12. The frequency synthesis circuit as claimed in claim 11, further comprising a thermometer encoder coupled between said noise-shaping quantizer and said digitally controlled oscillator.

13. The frequency synthesis circuit as claimed in claim 11, wherein said means for converting said input control signal is a coarse/fine separator.

14. The frequency synthesis circuit as claimed in claim 11, wherein said quantized line control signal has a bit resolution less than that of said fine control signal.

15. The frequency synthesis circuit as claimed in claim 11, wherein said digitally controlled oscillator comprises a plurality of delay elements connected in series.

* * * * *